(12) United States Patent
Kim (10) Patent No.: US 6,737,876 B1
(45) Date of Patent: May 18, 2004

(54) METHOD AND SYSTEM FOR DETERMINING AN OPERATING VOLTAGE USING A SOURCE/DRAIN TO GATE OVERLAP INDUCED SCALING FACTOR

(75) Inventor: Hyeon-Seag Kim, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 58 days.

(21) Appl. No.: 10/122,062

(22) Filed: Apr. 12, 2002

(51) Int. Cl.[7] .................. H01H 31/02; G01R 31/26; G01R 31/02
(52) U.S. Cl. .................. 324/719; 324/537; 324/763; 324/765
(58) Field of Search ............... 324/719, 763, 324/537, 765

(56) References Cited

U.S. PATENT DOCUMENTS 6,047,243 A * 4/2000 Bang et al. .................. 702/58
6,049,213 A * 4/2000 Abadeer ..................... 324/719
6,525,544 B1 * 2/2003 Okada ....................... 324/551

* cited by examiner

Primary Examiner—N. Le
Assistant Examiner—John Teresinski
(74) Attorney, Agent, or Firm—Winstead Sechrest & Minick P.C.

(57) ABSTRACT

A method and system for determining an operating voltage for a semiconductor device. A first plurality of lifetimes may be determined for a first plurality of semiconductor device where the polysilicon lines in each of the first plurality of semiconductor devices have the same total area but different peripheral lengths. A second plurality of lifetimes may be determined for a second plurality of semiconductor devices where the polysilicon lines in each of the second semiconductor device have the same peripheral length but different total areas. Further, the STI structures (used to separate one or more active areas) in each of the second plurality of semiconductor devices may have the same length as the STI structures (used to separate one or more active areas) in each of the first plurality of semiconductor devices. The operating voltage may be determined based on the first and second plurality of lifetimes.

15 Claims, 7 Drawing Sheets

METHOD AND SYSTEM FOR DETERMINING AN OPERATING VOLTAGE USING A SOURCE/DRAIN TO GATE OVERLAP INDUCED SCALING FACTOR

FIELD OF THE INVENTION

The present invention relates to semiconductor devices, and more particularly to a method and system for determining the operating voltage for a semiconductor device.

BACKGROUND OF THE INVENTION

Figure 1:
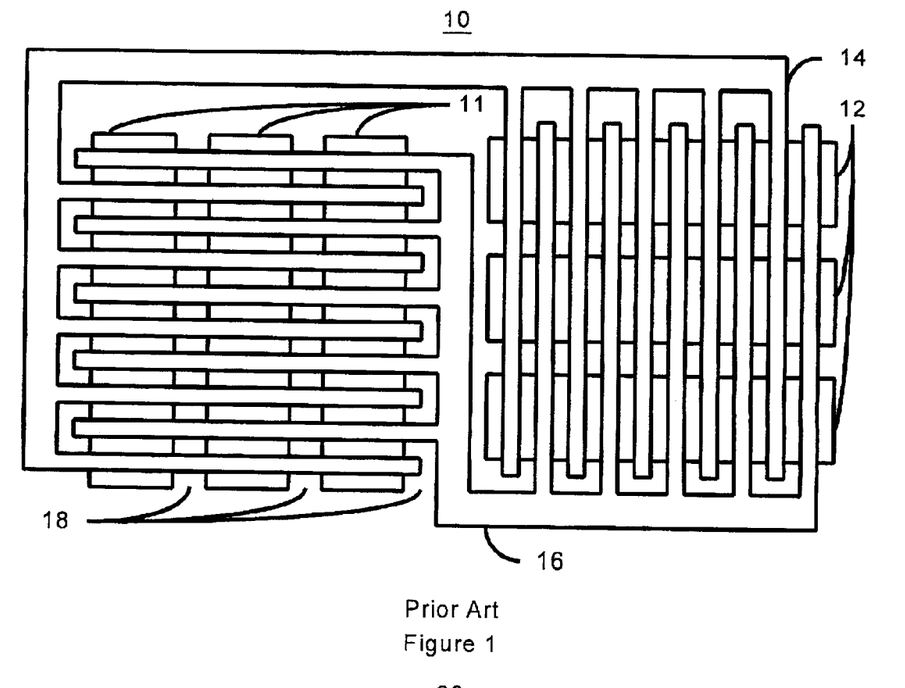
FIG. 1 is a high-level diagram of a conventional semiconductor device.

FIG. 1 depicts a conventional semiconductor device 10. The semiconductor device 10 includes active areas 11 and 12 where devices, such as memory cells and/or logic, are formed. Across the active areas 11 and 12 are conductive lines 14 and 16. The conductive lines 14 and 16 are preferably polysilicon lines. The semiconductor device 10 also conventional silicon trench isolation ("STI") structures 18 between the active areas 11 and 12. The STI isolation structures 18 are used to isolate different portions of a semiconductor device. Although only some of the conventional STI structures 18 are marked, there are additional conventional STI structures. Furthermore, the conventional semiconductor device 10 typically includes other devices (not shown).

Figure 2A:
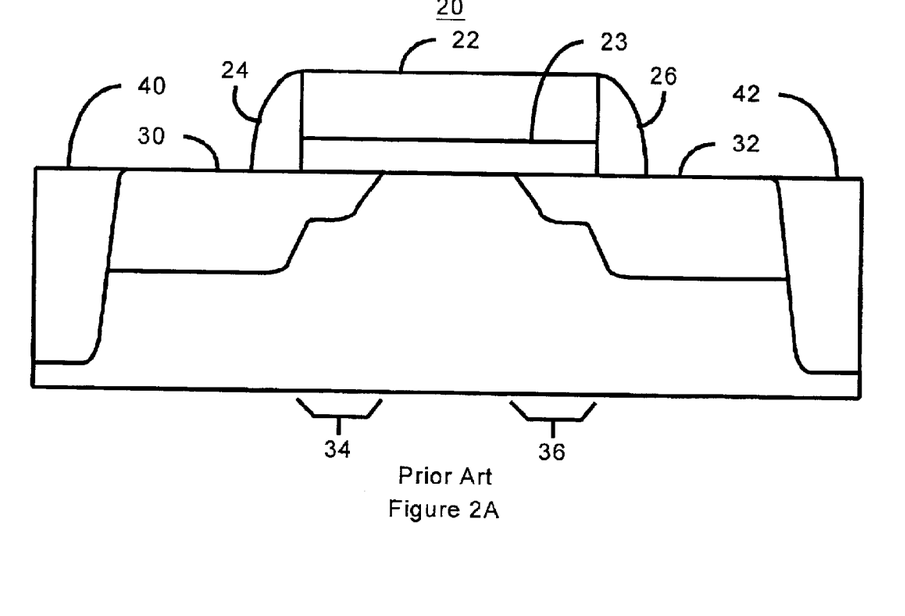
FIG. 2A is a more detailed diagram of a portion of the active area of the conventional semiconductor device.

FIG. 2 depicts a device 20 formed in the conventional semiconductor device 10. The conventional semiconductor device 10 could include other devices, such as, memory cells. The device 20 includes a gate 22 having spacers 24 and 26. The spacers 24 and 26 are typically between five hundred and one thousand Angstroms in thickness. The gate 22 is separated from the underlying substrate 21 using oxide 23. The device 20 also includes a source 30 and a drain 34. The source 30 also includes a source extension 34 that is under the gate 22. Similarly, the drain 32 includes a drain extension 36 that is under the gate 22. The source extension 34 and the drain extension 36 are typically between eighty and one hundred Angstroms in thickness. Also depicted are conventional STI structures 40 and 42 that isolate the device 20 from other portions of the semiconductor device 10.

In order to operate the conventional semiconductor device 10, an operating voltage must be selected. In order to choose the operating voltage, the maximum operating voltage allowed to be used with the conventional semiconductor device 10 is selected. In order to do so, the lifetime of the conventional semiconductor device is determined. Typically the lifetime is determined using a time dependent dielectric breakdown ("TDDB") test and/or a voltage ramp dielectric breakdown ("VRDB") test on a particular conventional semiconductor device 10. The TDDB test applies a particular voltage to the conventional semiconductor device 10 until the conventional semiconductor device 10 fails. The VRDB test applies an increasing voltage, typically one that increases in steps, to the conventional semiconductor device 10 until the conventional semiconductor device 10 fails. Thus, the lifetime of the conventional semiconductor device 10, including the dependence of the lifetime on the operating voltage, can be determined.

Based on the lifetime experimentally determined and the desired lifetime for the semiconductor device 10, the maximum operating voltage of the conventional semiconductor device 10 is determined. During operation, an operating voltage that is less than or equal to the maximum operating voltage is utilized. As a result, the conventional semiconductor device 10 should last for the desired amount of time. For example, it is typically desired to have a lifetime of ten years during use. The operating voltage used and the maximum operating voltage allowed to be used with the conventional semiconductor device 10 are set so that the lifetime of the conventional semiconductor device 10 is as desired.

Although the conventional semiconductor device 10 functions, one of ordinary skill in the art will readily realize that the polysilicon lines 14, 16 and 22 affect the lifetime at a particular operating voltage. In particular, the source extension 34 and the drain extension 36 can result in a weaker oxide 23. In addition, the areas of the source extension 34 and the drain extension 36 are sites for a low voltage leakage current, even for the off state of the device 20. Moreover, the effect of the leakage current increases as the length of the channel is decreased when the gate 22 is made less wide. Thus, as the conventional semiconductor device is scaled down to allow for a higher density of devices 20, problems due to leakage current, as well as problems with the quality of the oxide 23, increase. Consequently, it would be desirable to account for the overlap between the gate 22 and the source 30 and drain 34 in the area of the source extension 34 and the drain extension 36 could be accounted for.

Figure 2B:
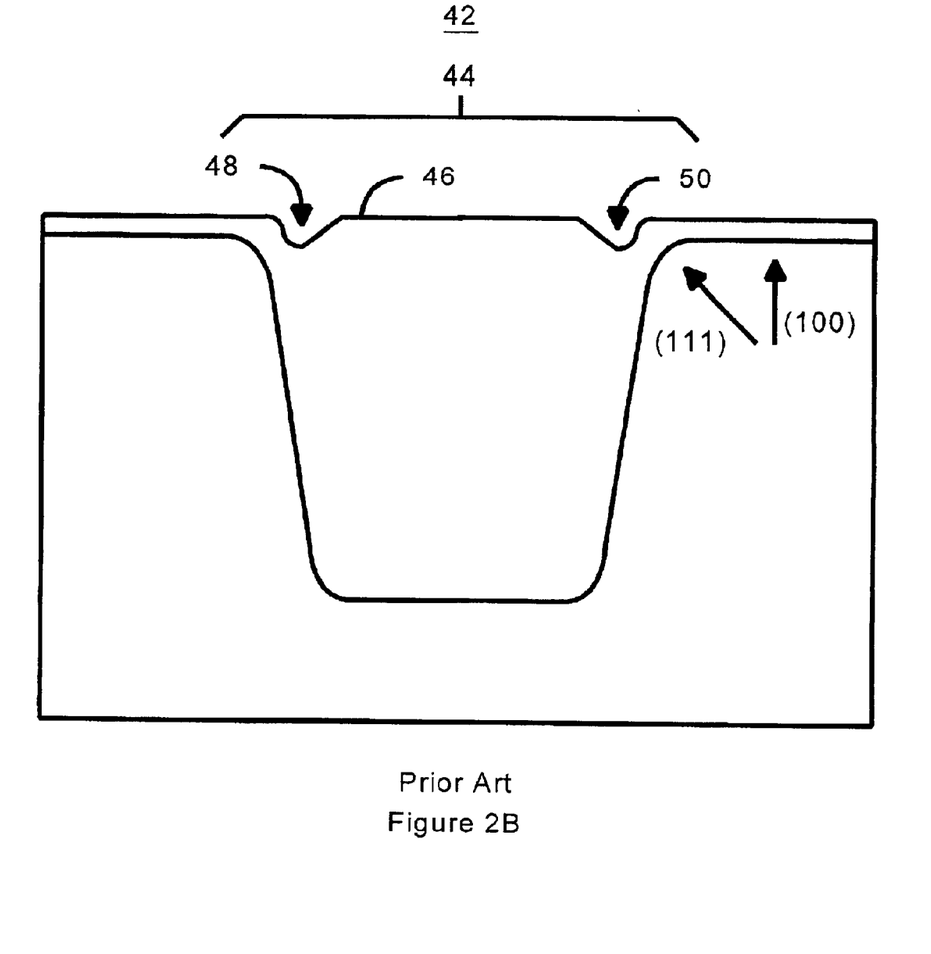
FIG. 2B is a more detailed diagram of a silicon trench isolation structure of the conventional semiconductor device.

Furthermore, the STI structures 18, 40 and 42 can reduce the lifetime of the device. FIG. 2B depicts a conventional STI structure 42. However, the other conventional STI structures in the conventional semiconductor device 10 may suffer from the same defects. The conventional STI structure 42 includes conventional trench 44, which is filled with conventional oxide filler 46. Near the corners of the conventional STI structure 42, the oxide filler 46 has thinned in areas 48 and 50. The thinned areas 48 and 50 reduce the ability of the STI structures 18, 40 and 42 to insulate the devices 20. As a result, a leakage current can occur through the thinned areas 18, 40 and 42. The leakage current can lower the threshold voltage of devices fabricated near the conventional STI structures 18, 40 and 42, which adversely affect performance of the conventional semiconductor device 10.

The thinned areas 48 and 50 may occur for a variety of reasons. Typically, silicon wafers having a (100) orientation (shown in FIG. 2B) are used for fabricating conventional semiconductor devices 10. Because the top surface has a (100) orientation, near the corners of the trenches 48 and 50, the exposed silicon has a (111) orientation. The (111) orientation of silicon has a larger number of dangling bonds. Thus, when the oxide filler 46 is provided, areas near the (111) orientation are thinner. In addition, mechanical stress tends to concentrate at areas where a corner is fabricated. Mechanical stress also tends to cause a thinning of the oxide filler 46 near the corners of the conventional STI structures 18, 40 and 42. In addition, as discussed above, in more recent conventional Flash memory devices, a nitride oxide, such as $N_2O$ is used in forming the gate oxide for the memory cells in the core region. When $N_2O$ is used, the thinning that results in the areas 48 and 50 is even more severe. Thus, the problems due to leakage current in the semiconductor device 10 are made worse.

Accordingly, what is needed is a system and method for determining the operating voltage of the semiconductor device that takes into account the overlap between the source and/or drain extensions and the polysilicon lines as well as the STI structures. The present invention addresses such a need.

SUMMARY OF THE INVENTION

The present invention provides a method and system for determining an operating voltage for a semiconductor device. The semiconductor device includes at least one active area, at least one silicon trench isolation (STI) structure and a plurality of polysilicon lines. The method and system comprise determining a first plurality of lifetimes and a second plurality of lifetimes. The first plurality of lifetimes is determined for a first plurality of semiconductor devices having a first plurality of polysilicon lines, at least a first active area and a first plurality of STI structures for separating the at least the first active area. The first plurality of polysilicon lines has a particular area and a plurality of peripheral lengths. Each of the first plurality of STI structures has a length. The second plurality of lifetimes is determined for a second plurality of semiconductor devices having a second plurality of polysilicon lines, at least a second active area and a second plurality of STI structures for separating the at least the second active area The second plurality of polysilicon lines has a plurality of areas and the particular peripheral length. Each of the second plurality of STI structures has the length. The method and system also comprise determining the operating voltage based on the first plurality of lifetimes and the second plurality of lifetimes.

According to the system and method disclosed herein, the present invention provides a method and system for determining the maximum operating voltage for a semiconductor device that takes into account the effects of STI structures separate from the effects of polysilicon lines.

DETAILED DESCRIPTION OF THE INVENTION

The present invention relates to an improvement in semiconductor devices. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown, but is to be accorded the widest scope consistent with the principles and features described herein.

The present invention provides a method and system for determining an operating voltage for a semiconductor device. The semiconductor device includes at least one active area, at least one silicon trench isolation (STI) structure and a plurality of polysilicon lines. The method and system comprise determining a first plurality of lifetimes and, a second plurality of lifetimes. The first plurality of lifetimes is determined for a first plurality of semiconductor devices having a first plurality of polysilicon lines, at least a first active area and a first plurality of STI structures for separating the at least the first active area. The first plurality of polysilicon lines has a particular area and a plurality of peripheral lengths. Each of the first plurality of STI structures has a length. The second plurality of lifetimes is determined for a second plurality of semiconductor devices having a second plurality of polysilicon lines, at least a second active area and a second plurality of STI structures for separating the at least the second active area. The second plurality of polysilicon lines has a plurality of areas and the particular peripheral length. Each of the second plurality of STI structures has the length. The method and system also comprise determining the operating voltage based on the first plurality of lifetimes and the second plurality of lifetimes.

The present invention will be described in terms of a particular semiconductor device and certain polysilicon lines. One of ordinary skill in the art will, however, recognize that the present invention can be used with other semiconductor devices including other devices and other materials analogous to polysilicon in forming the lines. The present invention will also be described in terms of a certain STI structures. One of ordinary skill in the art will, however, recognize that the present invention can be used with other semiconductor devices and other isolation structures.

Figure 3:
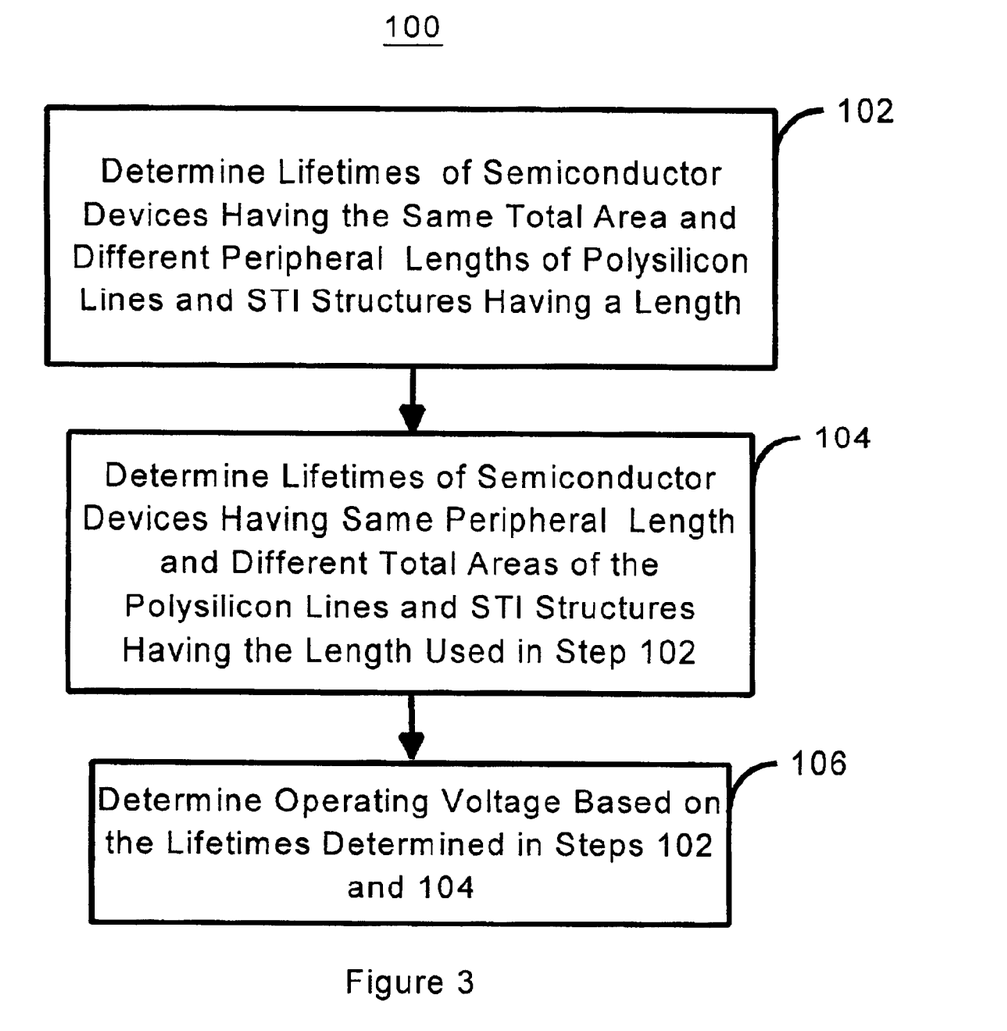
FIG. 3 is a high-level flow chart depicting one embodiment of a method in accordance with the present invention for determining an operating voltage for a semiconductor device.

To more particularly illustrate the method and system in accordance with the present invention, refer now to FIG. 3, depicting one embodiment of a method 100 in accordance with the present invention for determining an operating voltage for a semiconductor device. The semiconductor device has a plurality of polysilicon lines, which are generally used in forming devices, such as transistors. The semiconductor device also has an active area and STI structures separating portions of the semiconductor device, such as the active areas. The lifetimes for the semiconductor device are determined for the semiconductor device having polysilicon lines of a particular total area and a particular peripheral area and STI structures that have particular length, via step 102. Preferably, at least three different peripheral lengths of polysilicon lines are used in step 102. Preferably, at least three different peripheral lengths of polysilicon lines are used in step 102. The peripheral length of the polysilicon lines is the length of the perimeter of the polysilicon lines. The area is simply the total area occupied by the polysilicon lines. In determining the lifetimes, the TDDB and/or VRDB tests may be used. The VRDB test is faster. However, the TDDB test provides a better prediction of the lifetime of the semiconductor device under actual operating conditions. The lifetime of one of the devices, having a particular length and a particular area is typically calculated by using the fact that the lifetime of the test device, $t_{exp}$, is given by:

$$t_{exp} = A10^{(BE)} \quad (1)$$

where:
A=constant
B=field acceleration factor for the device
E=applied field the device The field acceleration factor, B, can be determined using the slope of the curve formed by plotting the lifetime of the device versus the applied voltage. Similarly, an activation energy, Ea, that is discussed below can be determined for the device by plotting the lifetime of the device versus the temperature at which the tests are conducted. The actual lifetime of the device is then given by:

$$T = t_{one}[\exp\{(E_a/k)(T_{op}+273)^{-1}-(T_{test}+273)^{-1})\}] \quad (2)$$

where:
t=expected lifetime of device
  =$Ae^{(BE)}$
E=applied field for the device
  =$V_{max}/\chi_{eff}$
$V_{max}$=Maximum applied voltage, or operating voltage
$\chi_{eff}$=effective thickness of the device
B=field acceleration factor for the device
$E_a$=activation energy of the device
k=Boltzman's constant
$T_{op}$=Operating temperature of device (in degrees C.)
$T_{test}$=Test temperature (usually higher than operating temp) (in degrees C.)

The effective thickness, $\chi_{eff}$, can be calculated using the VRDB test and using the following relationship:

$$V_{BD}(\text{device})(50\%)/T_{eff} = V_{BD}(\text{device})/T_{eff}(50\%) \quad (3)$$

where
$V_{BD}$(device)(50%)=breakdown voltage at a cumulative failure rate of 50%
$V_{BD}$(device)=actual breakdown voltage
$T_{eff}$(50%)=median thickness of device
$T_{eff}$=effective device thickness
  =$V_{BD}$(device)(50%)$T_{eff}$(50%)$V_{BD}$(device)

Once these quantities are determined, the lifetime can be determined.

Figure 4A:
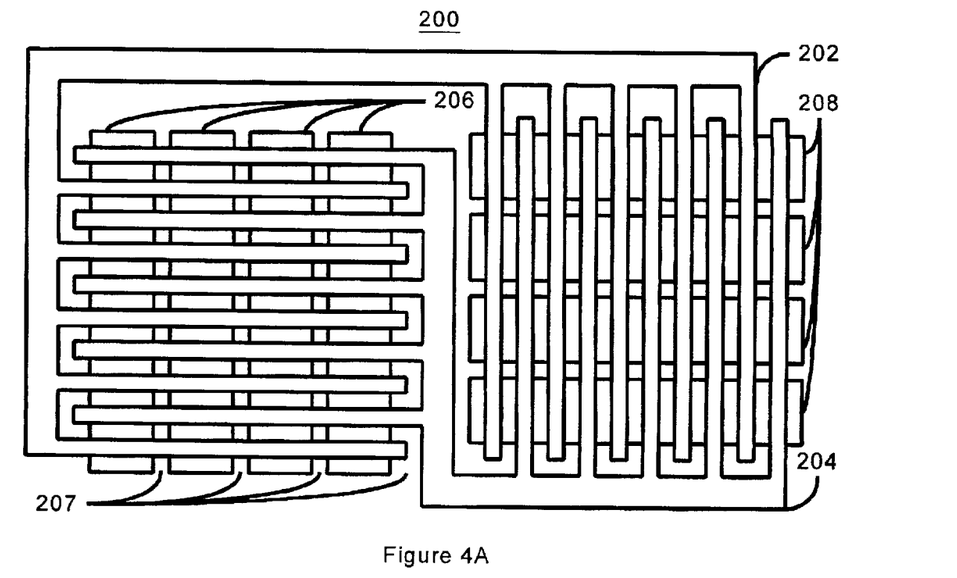
FIGS. 4A–4C depict different semiconductor devices that can be used in the method in accordance with the present invention for determining an operating voltage for a semiconductor device.
Figure 4B:
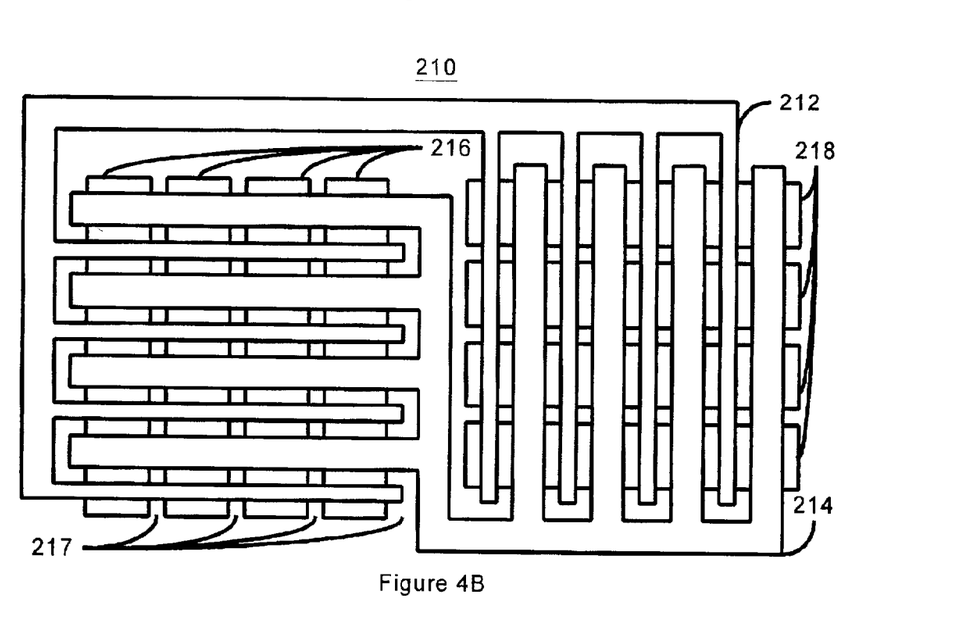
Figure 4C:
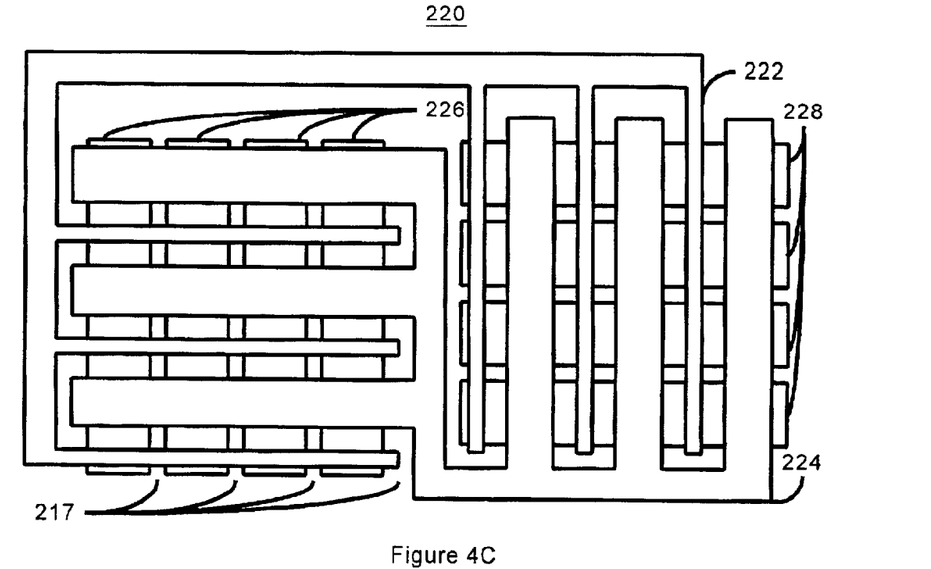

For example, FIGS. 4A–C depict three semiconductor devices 200, 210 and 220 including active areas 202, 212 and 222, respectively. Each semiconductor device 200, 210 or 220 has polysilicon lines 202 and 204, 212 and 214 and 222 and 224, respectively, as well as active areas 206 and 208, 216 and 218 and 226 and 228, respectively. The polysilicon lines 202 and 204, 212 and 214 and 222 and 224 all have the same total area in each semiconductor device 200, 210 and 220, respectively. However, the polysilicon lines 202 and 204, 212 and 214 and 222 and 224 have different total peripheral lengths. In one embodiment, the total area of each of the polysilicon lines 202 and 204, 212 and 214 and 222 and 224 is two thousand five hundred square micrometers. However, the peripheral lengths of the polysilicon lines 202 and 204, 212 and 214 and 222 and 224 differ. For example, the peripheral length of the polysilicon lines 202 and 204 is, in one embodiment, two thousand and fifty micrometers. The peripheral length of the polysilicon lines 212 and 214 is, in one embodiment, one thousand and fifty micrometers. The peripheral length of the polysilicon lines 222 and 224 is, in one embodiment, five hundred and fifty micrometers. The semiconductor devices 200, 210 and 220 also have labeled STI structures 207, 217 and 227, respectively. The STI structures 207, 217 and 227 separate the active areas 206, 216 and 226, respectively. Although not specifically labeled, STI structures separate the active areas 208, 218 and 228. The STI structures 207, 217 and 227 preferably have the same length. The length of an STI structure is the peripheral length, the length around the STI structure. Referring back to FIG. 3, thus, the lifetime for each of the semiconductor devices 200, 210 and 220 would be determined in step 102.

The lifetimes for the semiconductor device are determined for a particular peripheral length of STI structures, varying total areas of the active area(s) and the same pitch of the polysilicon lines, via step 104. Also in step 104 the lengths of the STI structures are the same. Preferably, at least three different total areas for the polysilicon lines are used in step 104. In a preferred embodiment, the lengths of the STI structures used in each semiconductor device is not only the same, but also the same as the length of the polysilicon lines used in step 102. However, in an alternate embodiment, the length of the STI structures used in step 104 could be different from the length of the STI structures used in step 102. In determining the lifetimes, the TDDB and/or VRDB tests may be used. The VRDB test is faster. However, the TDDB test provides a better prediction of the lifetime of the semiconductor device under actual operating conditions. The lifetimes determined in step 104 would follow the relationships discussed above with respect to step 102.

Figure 5A:
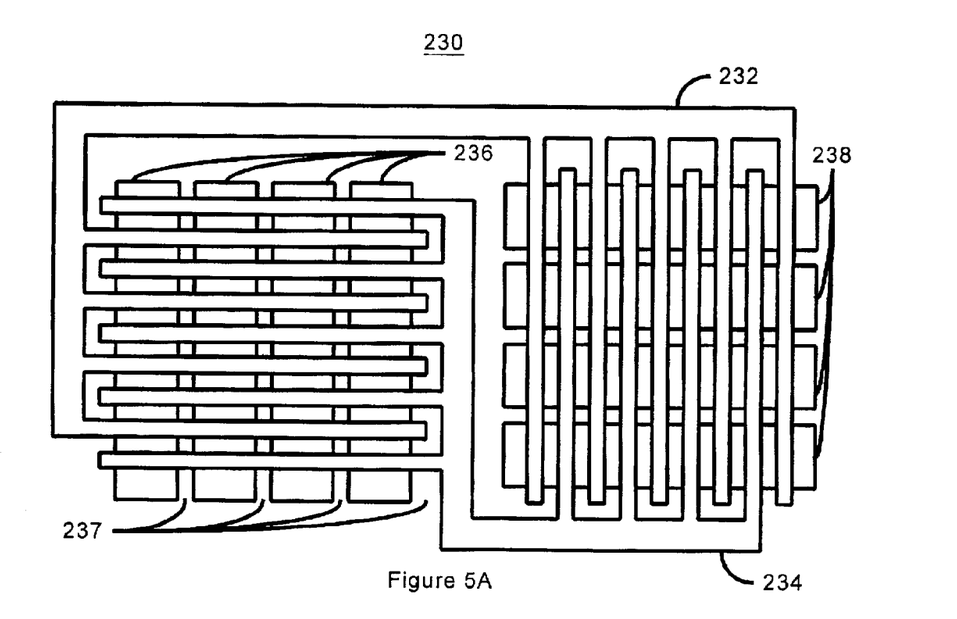
FIGS. 5A–5C depict different semiconductor devices that can be used in the method in accordance with the present invention for determining an operating voltage for a semiconductor device.
Figure 5B:
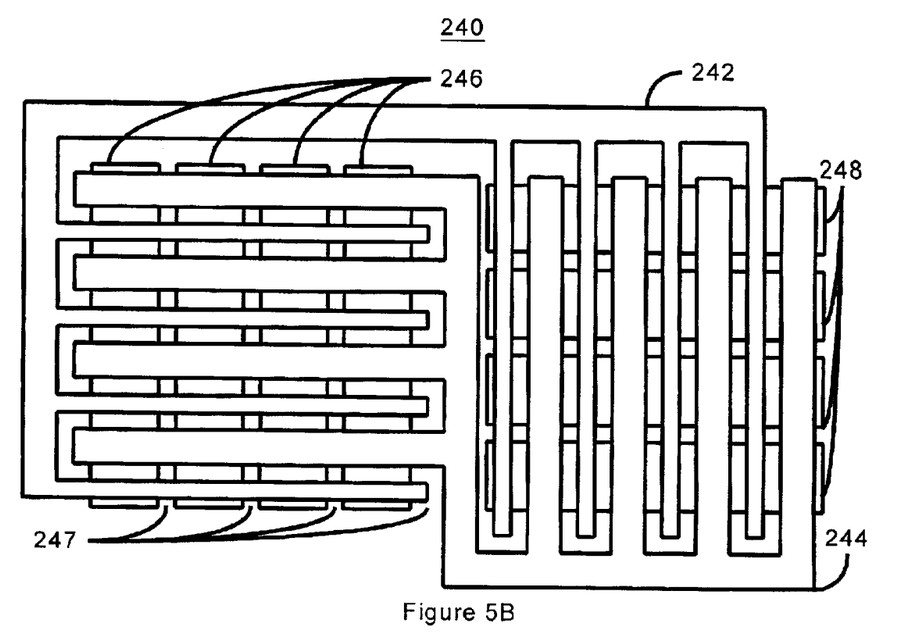
Figure 5C:
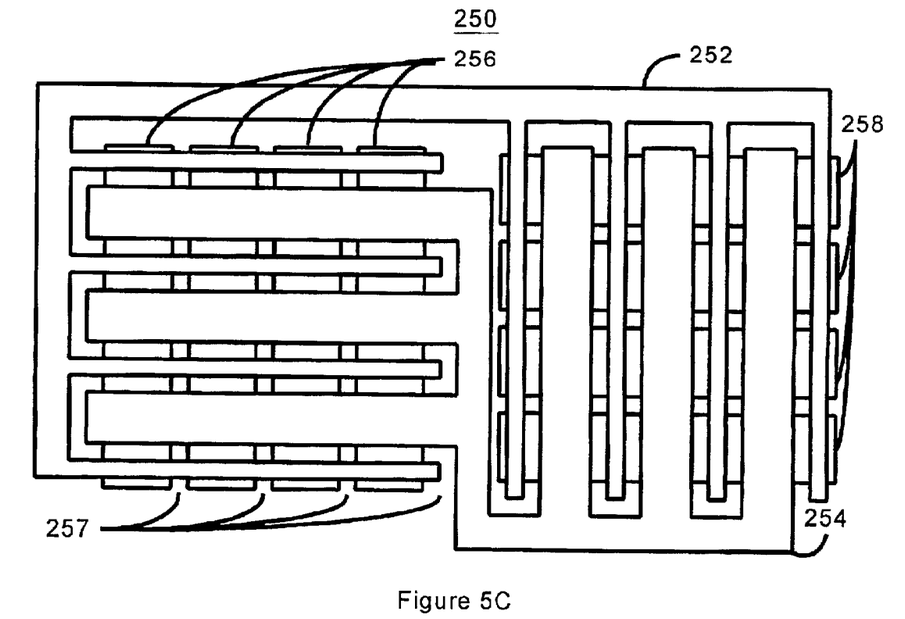

For example, FIGS. 5A–5C depict three semiconductor device 230, 240 and 250. Each semiconductor device 230, 240 and 250 includes polysilicon lines 232 and 234, 242 and 244 and 252 and 254, respectively. The semiconductor devices 230, 240 and 250 also include active areas 236 and 238, 246 and 248 and 256 and 258, respectively. The polysilicon lines 232 and 234, 242 and 244 and 252 and 225 all have the same peripheral length in each semiconductor device 200, 210 and 220, respectively. However, the, polysilicon lines 232 and 234, 242 and 244 and 252 and 254 have different total areas. In one embodiment, the total peripheral length is two thousand and fifty micrometers. However, the areas of the polysilicon lines 232 and 234, 242 and 244 and 252 and 254 differ. For example, the total area of the polysilicon lines 232 and 234 is, in one embodiment, two thousand five hundred square micrometers (equivalent to a fifty micrometer by fifty micrometer square). The peripheral length of the polysilicon lines 232 and 234 is, in one embodiment, two thousand and fifty micrometers. The total area of the polysilicon lines 242 and 244 is, in one embodiment, ten thousand square micrometers (equivalent to a one hundred micrometer by one hundred micrometer square). The peripheral length of the polysilicon lines 242 and 244 is, in one embodiment, two thousand and fifty micrometers. The total area of the polysilicon lines 252 and 254 is, in one embodiment, equivalent to a one hundred and fifty micrometer by one hundred and fifty micrometer square. The peripheral length of the polysilicon lines 252 and 254 is, in one embodiment, two thousand and fifty micrometers. The semiconductor devices 230, 240 and 250 also have labeled STI structures 237, 247 and 257, respectively. The STI structures 237, 247 and 257 separate the active areas 236, 246 and 256, respectively. Although not specifically labeled, STI structures separate the active areas 238, 248 and 258. The STI structures 237, 247 and 257 preferably have the same length, which is also the same as the length of the STI structures 207, 217 and 227 shown in FIGS. 4A–4C, respectively. Referring back to FIGS. 5A–5C, the length of an STI structure is the peripheral length, the length around the STI structure. Thus, the lifetime for each of the semiconductor devices 230, 240 and 250 would be determined in step 104.

Using the lifetimes determined in steps 102 and 104, an operating voltage that takes into account the area of the area and peripheral length of the polysilicon lines is determined, via step 106. In a preferred embodiment, the operating voltage is a maximum operating voltage. Preferably, the operating voltage is determined using maximum voltage and equation (2) that delineates the relationship between the operating (or maximum) voltage and the lifetime. Preferably, step 106 includes determining the relationship between the lifetime and the peripheral length of the polysilicon lines using the data from step 102 and determining the relationship between the lifetime and the area of the polysilicon lines using the data from step 104. These relationships can then be used to scale the operating voltage, particularly the maximum operating voltage, based on the configuration of the semiconductor device. Furthermore, because the lengths of the STI structures does not change, the effects of the source and/or drain extension overlap on the polysilicon lines can be isolated from the effects of the STI structures. Thus, a truer picture the effects of the overlap of the source and/or drain extension on the lifetime of the device can be obtained.

Figure 6:
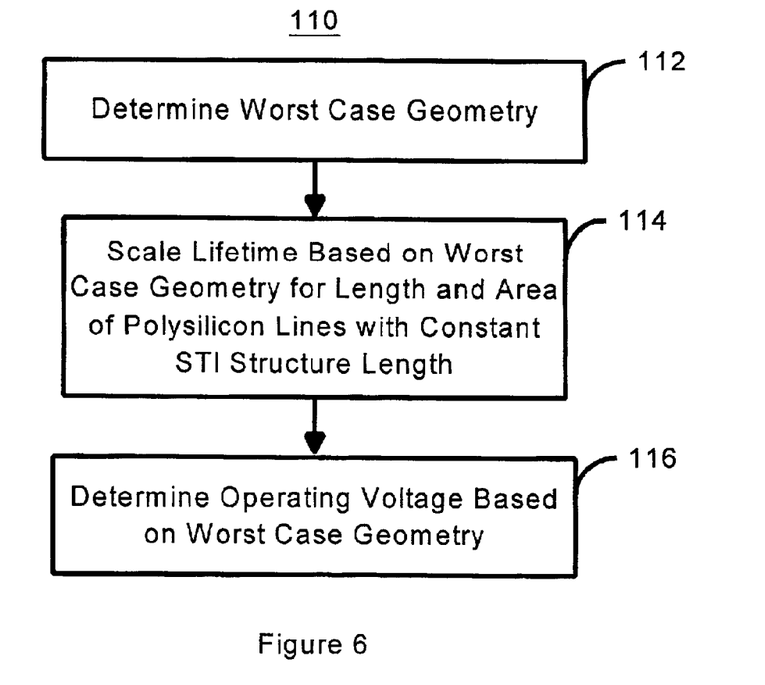
FIG. 6 depicts one embodiment of a method in accordance with the present invention for scaling the operating voltage based on the STI structures.

FIG. 6 depicts one embodiment of a method 110 in accordance with the present invention for determining the operating voltage based on the geometry of the device. Thus, the method 110 allows the area of the active area and length of the STI structures to be taken into account in determining the operating voltage. The worst case geometry for the device is determined, via step 112. Preferably, step 112 determines the geometry for which the lifetime will be the shortest. In addition, step 112 preferably utilizes an actual test geometry to determine the worst case geometry.

Figure 7:
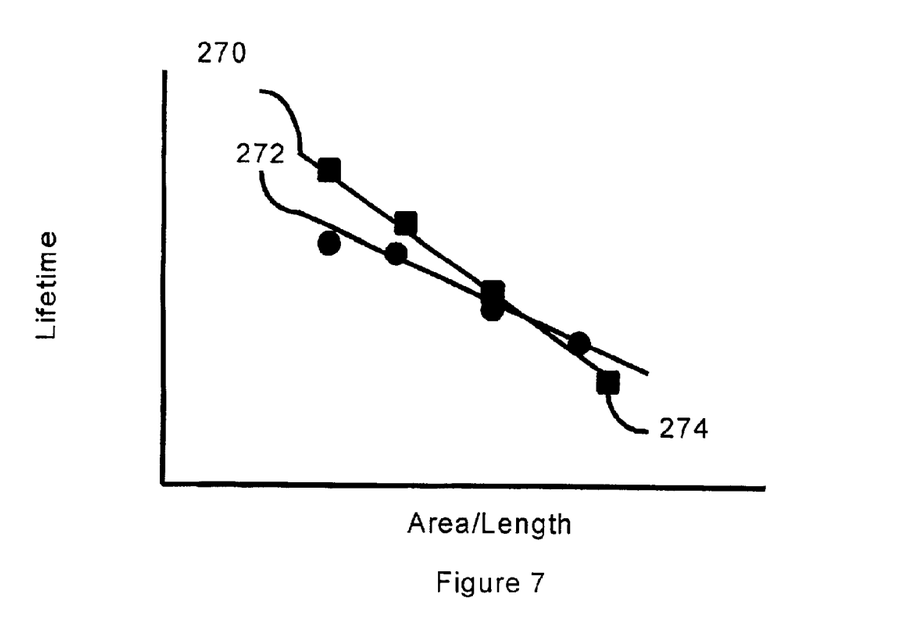
FIG. 7 depicts the lifetime versus STI length and area of the active area for one embodiment of the method in accordance with the present invention for determining an operating voltage for a semiconductor device.

For example, FIG. 7 depicts the lifetime versus area of the polysilicon lines 270 and lifetime versus length of the polysilicon lines 272 for one embodiment of the method and system in accordance with the present invention. Using these curves 270 and 272, the worse case, or shortest lifetime, is selected to scale the lifetime and operating voltage with area and length. In the case of the curves 270 and 272, the worst combination resulting in the shortest lifetime is the largest area from the curve 270. Referring to FIGS. 6 and 7, the worst-case geometry determined in step 112 would thus preferably be the data point 274 of the worst case selected in step 112.

Referring back to FIG. 6, the lifetimes determined using the method 100 are scaled using the geometry selected in step 112 in order to account for the area and/or the length of the polysilicon lines, via step 114. In order to do so, the lifetime can be scaled based on area, where the worst-case geometry is from a test device in which area was changed, or based on polysilicon line peripheral length, where the worst-case geometry is from a test device in which the polysilicon line peripheral length was changed. Where the lifetime is to be scaled based on the area in order to determine a lifetime for a product, the following relationship is used:

$$\tau_{TD}/\tau_p = A_{TD}/A_p \quad (4)$$

where $\tau_{TD}$=lifetime of the test device $\tau_p$=scaled lifetime of the product being produced $A_{TD}$=area of polysilicon lines for the test device $A_p$=area of polysilicon lines for the product being produced Similarly, when the lifetime is to be scaled based on the STI length in order to determine a lifetime for a product, the following relationship is used:

$$\tau_{TD}/\tau_p = L_{TD}/L_p \quad (5)$$

where $\tau_{TD}$=lifetime of the test device $\tau_p$=scaled lifetime of the product being produced $L_{TD}$=peripheral length of polysilicon lines for the test device $L_p$=peripheral length of polysilicon lines for the product being produced Once the lifetime has been scaled using the relationship in equation (4) or (5), the operating voltage is determined, via step 116. Step 116 preferably includes inputting the lifetime of the product that has been scaled, $\tau_p$, into equation (2) and determining the maximum operating voltage, Vmax, based on the scaled lifetime.

Because the shape of the polysilicon lines is accounted for, the source and/or drain extension overlap is accounted for using the methods 100 and 110. The source and/or drain extension overlap changes the performance and lifetime of the semiconductor device depending, in part, on the channel lengths. Moreover, because the length of the STI structures was unchanged, the effects of the source and/or drain extension overlap on the lifetime of the semiconductor device can be isolated. Thus, the effects of the source and/or drain extension overlap depends on the width of the polysilicon lines. Consequently, the area and peripheral length of the polysilicon lines is related to the effects of the source and/or drain extension overlap on the lifetime of the device. Thus, accounting for the area and peripheral length of the polysilicon lines using the methods 100 and/or 110 allows the source and/or drain extension overlap to be accounted for in determining the operating voltages for the semiconductor device.

A method and system has been disclosed for determining an operating voltage for a semiconductor device. Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A method for determining an operating voltage for a semiconductor device including at least one active area, at least one silicon trench isolation (STI) structure, and a plurality of polysilicon lines, the method comprising the steps of:

(a) determining a first plurality of lifetimes for a first plurality of semiconductor devices having a first plurality of polysilicon lines, at least a first active area and a first plurality of STI structures for separating the at least the first active area, the first plurality of polysilicon lines having a particular area and a plurality of peripheral lengths, the first plurality of STI structures having a length;

(b) determining a second plurality of lifetimes for a second plurality of semiconductor devices having a second plurality of polysilicon lines, at least a second active area and a second plurality of STI structures for separating the at least the second active area, the second plurality of polysilicon lines having a plurality of areas and the particular peripheral length, the second plurality of STI structures having the length;

(c) determining the operating voltage based on the first plurality of lifetimes and the second plurality of lifetimes.

2. The method of claim 1 wherein the first plurality of lifetimes determining step (a) further includes the steps of:

(a1) using a time dependent dielectric breakdown test in order to determine the first plurality of lifetimes.

3. The method of claim 1 wherein the second plurality of lifetimes determining step (b) further includes the steps of:

(b1) using a time dependent dielectric breakdown test in order to determine the second plurality of lifetimes.

4. The method of claim 1 wherein the first plurality of lifetimes determining step (a) further includes the steps of:

(a1) using a voltage ramp dielectric breakdown test in order to determine the first plurality of lifetimes.

5. The method of claim 1 wherein the second plurality of lifetimes determining step (b) further includes the steps of:

(b1) using a voltage ramp dielectric breakdown test in order to determine the second plurality of lifetimes.

6. The method of claim 1 wherein the operating voltage is a maximum operating voltage.

7. The method of claim 1 wherein the operating voltage determining step (c) includes the steps of:

(c1) determining a particular geometry for the semiconductor device, the particular geometry corresponding to a particular lifetime;

(c2) scaling the particular lifetime to take into account a particular length of the at least one STI structure, a total area of the plurality of polysilicon lines and/or a peripheral length of the plurality of polysilicon lines; and (c3) determining the operating voltage based upon the scaled lifetime.

8. The method of claim 7 wherein the particular geometry is a worst-case geometry.

9. A method for operating a semiconductor device including at least one active area, at least one silicon trench isolation (STI) structure and a plurality of polysilicon lines, the method comprising the steps of:

(a) applying an operating voltage, operating voltage being determined based on a first plurality of lifetimes and a second plurality of lifetimes, the first plurality of lifetimes being determined for a first plurality of semiconductor devices including a first plurality of polysilicon lines, at least one active area and a first plurality of STI structures, the first plurality of polysilicon lines having a plurality of peripheral lengths and a particular total area, the first plurality of STI structures having a length for separating the at least the first active area, the second plurality of lifetimes being determined for a second plurality of semiconductor devices having at least a second active area, a second plurality of STI structures for separating the at least the second active area and a second plurality of polysilicon lines, the second plurality of polysilicon lines having a particular peripheral length and a plurality of total areas, the second plurality of STI structures having the length.

10. The method of claim 9 wherein the operating voltage is further determined by determining a particular geometry for the semiconductor device, the particular geometry corresponding to a particular lifetime, scaling the particular lifetime to take into account an area of the plurality of polysilicon lines and a peripheral length of the plurality of polysilicon lines, and determining the operating voltage based upon the scaled lifetime.

11. The method of claim 10 wherein the particular geometry is a worst-case geometry.

12. A method for determining an operating voltage for a semiconductor device comprising the steps of:

determining a first plurality of lifetimes for a first plurality of semiconductor devices, wherein each of said first plurality of semiconductor devices comprises polysilicon lines and silicon trench isolation (STI) structures, wherein said polysilicon lines in each of said first plurality of semiconductor devices have the same total area but different peripheral lengths;

determining a second plurality of lifetimes for a second plurality of semiconductor devices, wherein each of said second plurality of semiconductor devices comprises polysilicon lines and STI structures, wherein said polysilicon lines in each of said second plurality of semiconductor devices have the same peripheral length but different total areas, wherein said STI structures in each of said second plurality of semiconductor devices have the same length as said STI structures in each of said first plurality of semiconductor devices; and determining said operating voltage based on said first and said second plurality of lifetimes.

13. The method as recited in claim 12, wherein said first and said second lifetimes are determined using a time dependent dielectric breakdown test.

14. The method as recited in claim 12, wherein said first and said second lifetimes are determined using a voltage ramp dielectric breakdown test.

15. The method as recited in claim 12 further comprising the steps of:

determining the relationship between said first plurality of lifetimes and the peripheral lengths of said polysilicon lines of said first plurality of semiconductor devices;

determining the relationship between said second plurality of lifetimes and the area of said polysilicon lines of said second plurality of semiconductor devices; and scaling said operating voltage based on the relationship between said first plurality of lifetimes and the peripheral lengths of said polysilicon lines of said first plurality of semiconductor devices and based on the relationship between said second plurality of lifetimes and the area of said polysilicon lines of said second plurality of semiconductor devices.

* * * * *